(12) United States Patent
Egerer et al.

(10) Patent No.: US 6,919,755 B2
(45) Date of Patent: Jul. 19, 2005

(54) VOLTAGE REGULATOR

(75) Inventors: Jens Egerer, Munich (DE); Thomas Borst, Neubiberg (DE)

(73) Assignee: Infineon Technologies AG (DE)

( * ) Notice: Subject to any disclaimer, the term of this patent is extended or adjusted under 35 U.S.C. 154(b) by 28 days.

(21) Appl. No.: 10/464,611

(22) Filed: Jun. 18, 2003

(65) Prior Publication Data

US 2004/0075421 A1 Apr. 22, 2004

(30) Foreign Application Priority Data

Jun. 19, 2002 (DE) .......................... 102 27 335

(51) Int. Cl.$^7$ .............................................. H01J 19/82
(52) U.S. Cl. ...................................................... 327/530
(58) Field of Search ................................ 327/530, 534, 327/535, 538, 540, 541, 543

(56) References Cited

U.S. PATENT DOCUMENTS 6,122,205 A * 9/2000 Yach ..................... 365/189.06
6,229,384 B1 * 5/2001 Ohsawa ...................... 327/541
6,265,932 B1 * 7/2001 Miyawaki .................... 327/535

FOREIGN PATENT DOCUMENTS

DE       199 30 036 A1    1/2001

* cited by examiner

*Primary Examiner*—Adolf Berhane
(74) *Attorney, Agent, or Firm*—St. Onge Steward Johnston & Reens LLC

(57) ABSTRACT

The invention relates to a voltage regulating circuit arrangement for converting a first voltage (VEXT) applied to an input of said voltage regulating circuit arrangement into a second voltage (VBLH) that may be tapped at an output of said voltage regulating circuit arrangement, wherein, when said first voltage (VEXT) falls below a threshold value (VEXT_THRESHOLD), the first voltage (VEXT) applied to the input of said voltage regulating circuit arrangement is connected through to said output of said voltage regulating circuit arrangement.

9 Claims, 2 Drawing Sheets

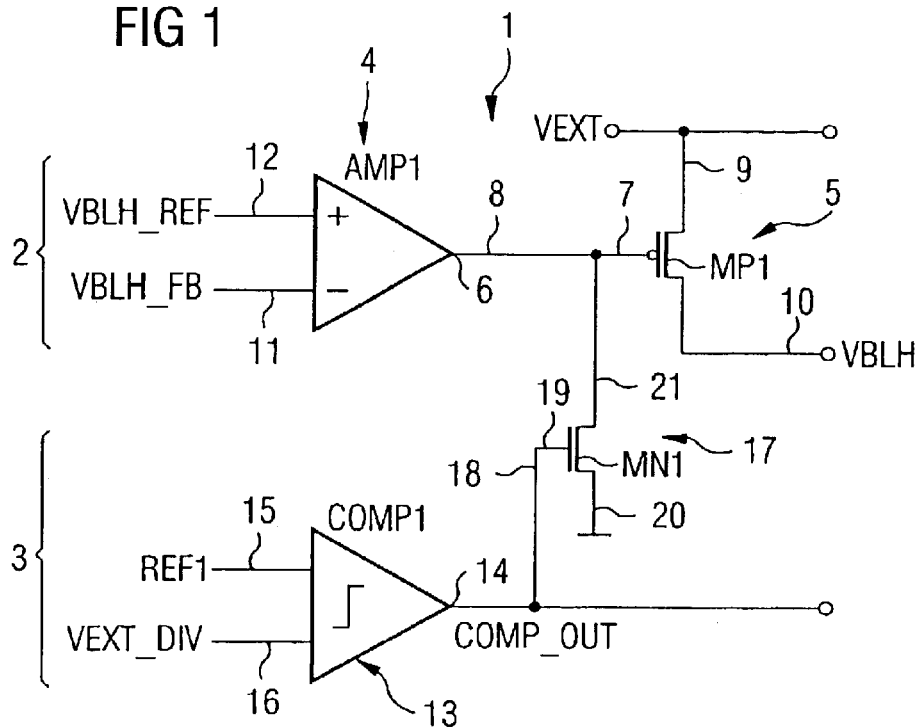
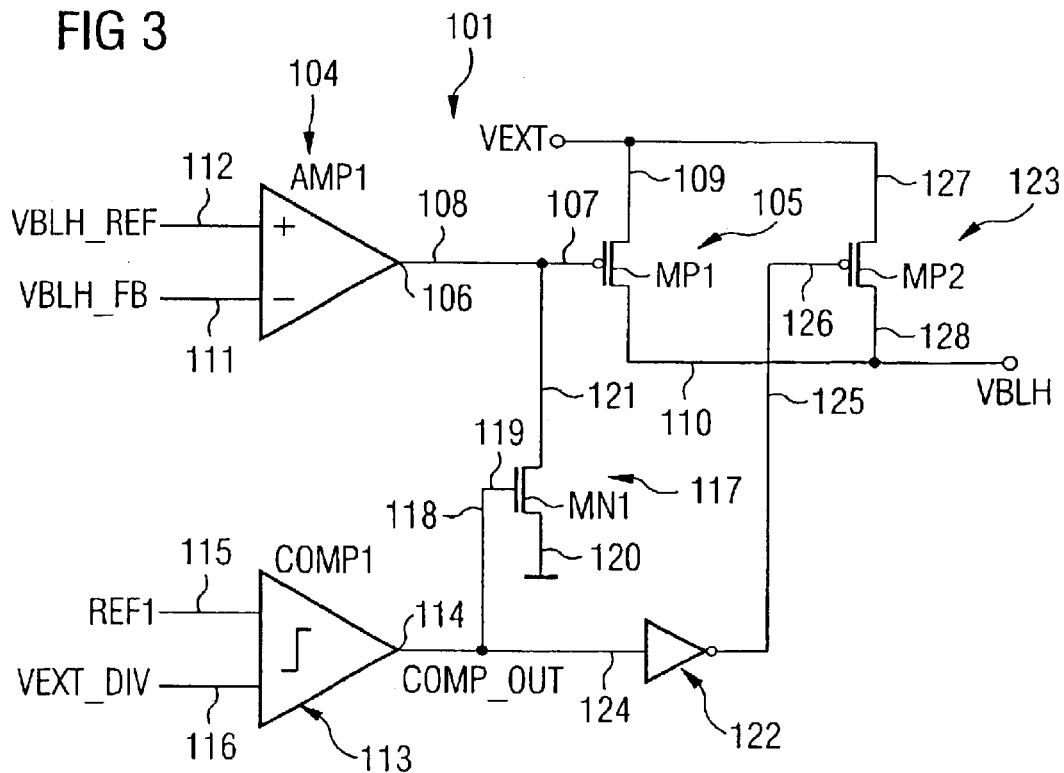

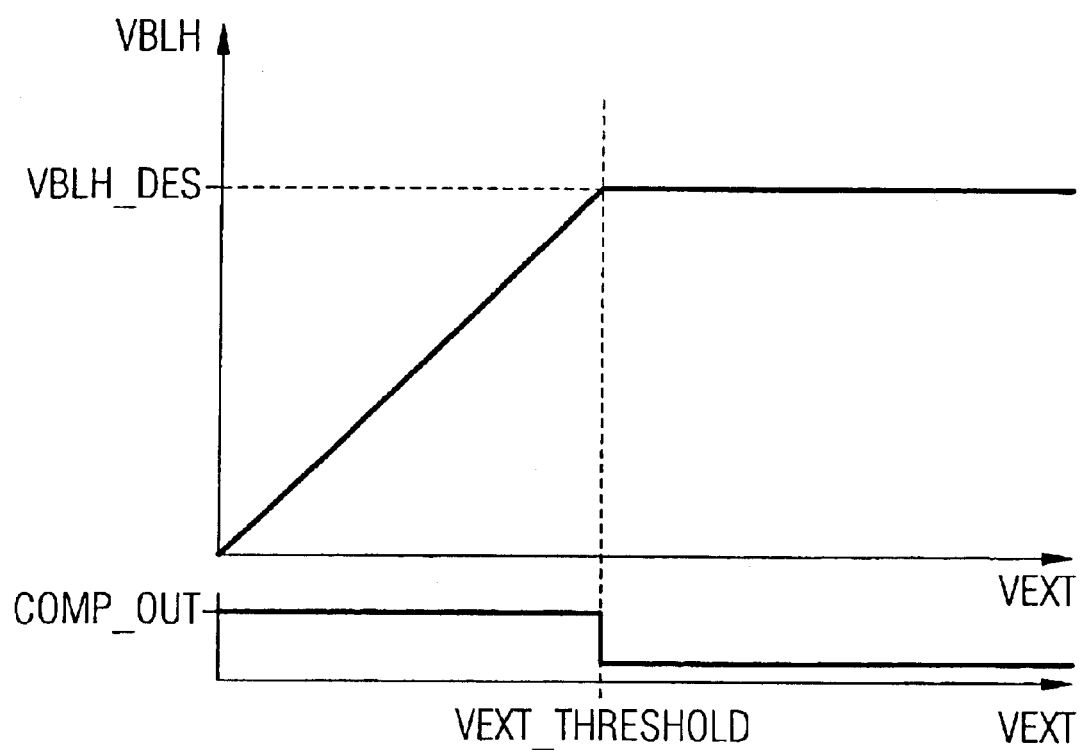

VOLTAGE REGULATOR

This application claims priority from pending German Patent Application No. 102 27 335.9 filed on Jun. 19, 2002.

FIELD OF THE INVENTION

The invention relates to a voltage regulating circuit arrangement in accordance with the preamble of claim 1.

In the case of semiconductor devices, in particular in the case of memory devices such as DRAMs (DRAM=Dynamic Random Access Memory), a voltage level used internally in the device may differ from an external voltage level used outside the device.

In particular may the internally used voltage level be smaller than the externally used voltage level—for instance may the internally used voltage level be 1.5 V and the externally used voltage level may e.g. range between 1.5 V to 2.5 V.

An internal voltage level that is reduced vis-á-vis the externally used voltage level has the advantage that the power losses in the semiconductor device may be reduced thereby.

Furthermore, the external voltage supply may be subject to relatively strong fluctuations and is therefore usually—in order that the device can be operated without fault—converted by means of a voltage regulator into an internal voltage (which is subject to relatively minor fluctuations only and is regulated at a particular, constant, reduced value).

Conventional voltage regulators may e.g. comprise a differential amplifier and a field effect transistor. The gate of the field effect transistor may be connected to an output of the differential amplifier, and the source of the field effect transistor may e.g. be connected to the external voltage supply.

A reference voltage—that is subject to relatively minor fluctuations only—is applied to the positive input of the differential amplifier. The voltage output at the drain of the field effect transistor may be fed back to the negative input of the differential amplifier directly, or e.g. by interposing a voltage divider.

The differential amplifier regulates the voltage applied to the gate terminal of the field effect transistor such that the (fed-back) drain voltage—and thus the voltage output by the voltage regulator—is constant and as high as the reference voltage, or e.g. by a certain factor higher.

It is an object of the invention to provide a novel voltage regulating circuit arrangement.

This and further objects are solved by the subject-matter of claim 1.

Advantageous further developments of the invention are indicated in the subclaims.

Pursuant to a basic idea of the invention, a voltage regulating circuit arrangement is provided by means of which a first voltage (VEXT) applied to an input of the voltage regulating circuit arrangement is converted into a second voltage which may be tapped at an output of the voltage regulating circuit arrangement, wherein, when the first voltage (VEXT) falls below a threshold value, the first voltage (VEXT) applied to the input of the voltage regulating circuit arrangement is connected through to the output of the voltage regulating circuit arrangement.

Particularly advantageously is the second voltage regulated by means of a regulating device at a predetermined value, the regulating device comprising a transistor interposed between the input and the output of the voltage regulating circuit arrangement.

In a preferred embodiment of the invention, the threshold value, at the falling below of which the first voltage (VEXT) applied to the input of the voltage regulating circuit arrangement is connected through to the output of the voltage regulating circuit arrangement, is approximately as high as, or somewhat higher than, the predetermined value at which the second voltage is regulated by the regulating device.

Preferably, the through-connection of the first voltage (VEXT) applied to the input of the voltage regulating circuit arrangement to the output of the voltage regulating circuit arrangement is achieved by the transistor provided at the regulating device being (fully) switched on if the threshold value is fallen below.

This prevents that—on approximation of the value of the first voltage (VEXT) (from initially higher values) to the desired value of the second voltage—too high a voltage drop occurs over the transistor, this causing the second voltage to decrease too much.

BRIEF DESCRIPTION OF THE DRAWINGS

In the following, the invention will be explained in detail by means of several embodiments and the enclosed drawings. The drawings show:

FIG. 1 a schematic representation of a voltage regulating circuit arrangement comprising a voltage regulating switch-off device with comparator, in accordance with a first embodiment of the present invention;

FIG. 2 a schematic representation of the value of the output voltage of the voltage regulating circuit arrangement illustrated in FIG. 1, and of the value of the voltage at the output of the comparator, each as a function of the value of the supply voltage; and FIG. 3 a schematic representation of a voltage regulating circuit arrangement according to another embodiment of the present invention.

DETAILED DESCRIPTION OF THE DRAWINGS

FIG. 1 shows a schematic representation of a voltage regulating circuit arrangement 1 in accordance with a first embodiment of the present invention.

The voltage regulating circuit arrangement 1 may e.g. be installed in a DRAM memory device which is, for instance, based on CMOS technology.

It comprises a voltage regulator 2 of conventional construction, and a voltage regulator switch-off device 3.

The voltage regulator 2 comprises a differential amplifier (AMP1) 4 with a positive input 12 and a negative input 11, and a field effect transistor 5 (here: a p-channel field effect transistor (MP1)).

An output 6 of the differential amplifier 4 is connected with a gate terminal 7 of the field effect transistor 5 via a line 8.

As is further shown in FIG. 1, the source of the field effect transistor 5 is connected via a line 9 to the supply voltage (VEXT) which is unregulated, i.e. subject to (partially relatively strong) fluctuations. The value of the supply voltage (VEXT) may, for instance, range between 1.5 V and 2.5 V, e.g. be 1.8 V.

A reference voltage (VBLH_REF)—which is subject to only relatively minor fluctuations and is available internally in the device or has been obtained conventionally, respectively—is applied to the positive input 12 of the differential amplifier 4.

In a first development of the voltage regulator 2, the voltage (VBLH) output at the drain of the field effect transistor 5 is fed back directly to the differential amplifier 4; the drain of the field effect transistor 5 to this end may be (directly) connected via a line 10 to the negative input 11 of the differential amplifier 4 (the fed-back voltage (VBLH_FB) applied to the negative input 11 of the differential amplifier 4 then is as high as the drain voltage (VBLH)).

In a second, alternative development, the voltage (VBLH) output at the drain of the field effect transistor 5 is fed back to the differential amplifier 4 by interposing a voltage divider (not illustrated), i.e. in a divided way. To this end, the drain of the field effect transistor 5 may be connected via the line 10 to a first resistor $R_2$ (not illustrated) of the voltage divider which, on the one hand, is connected with the ground (via a further voltage divider resistor $R_1$ (not illustrated, either)) and, on the other hand, with the negative input 11 of the differential amplifier 4 (the fed-back voltage (VBLH_FB) applied to the negative input 11 of the differential amplifier 4 is then by a certain factor smaller than the drain voltage (VBLH)).

In the case of the above-mentioned first development of the voltage regulator 2 (with direct feed-back of the drain voltage (VBLH)), the differential amplifier 4 regulates the voltage applied to the gate terminal 7 of the field effect transistor 5 such that the (fed-back) drain voltage (VBLH) is as high as the reference voltage (VBLH_REF).

As compared to this, in the case of the above-explained second, alternative development of the voltage regulator 2—where the drain voltage (VBLH) is not fed back directly, but by means of the above-mentioned voltage divider—the voltage applied to the gate terminal 7 of the field effect transistor 5 is regulated by the differential amplifier 4 such that the following applies:

$$VBLH = VBLH\_REF \times (1 + (R_2/R_1)) \quad \text{(formula (1))}$$

The voltage (VBLH) output at the drain of the field effect transistor 5 constitutes the output voltage of the voltage regulating circuit arrangement 1 (the line 10 connected with the drain of the field effect transistor 5 may, for instance, be additionally connected with an output—not illustrated—of the voltage regulating circuit arrangement 1).

By the above-mentioned regulation it is achieved that the output voltage (VBLH) of the voltage regulating circuit arrangement 1, as is e.g. illustrated in FIG. 2, has—in contrast to the supply voltage (VEXT) which may be subject to partially relatively strong fluctuations—a constant value VBLH_DES—e.g. 1.5 V (but only when the supply voltage (VEXT) is higher than a certain threshold value (VEXT_THRESHOLD)—cf. the explanations below).

The value of VBLH_DES may, in the case of the above-mentioned second, alternative development of the voltage regulator 2 in accordance with the above-mentioned formula (1)—with predetermined value of the reference voltage (VBLH_REF)—e.g. be adjusted to the respectively desired value by the resistor $R_2$ or the resistor $R_1$, respectively, being dimensioned appropriately (or, more exactly, the ratio of the resistance values $(R_2/R_1)$ is correspondingly chosen such that, in accordance with the above-mentioned formula (1), a corresponding—desired—value for VBLH results).

As was already mentioned above, in the case of the circuit arrangement according to FIG. 1, a voltage control switch-off device 3 is provided in addition to the voltage regulator 2. This device comprises a comparator (COMP1) 13 having two inputs 15, 16 and one (logic) output 14, and a further field effect transistor 17 (here: an n-channel field effect transistor (MN1)).

The output 14 of the comparator 13 is connected via a line 18 to a gate terminal 19 of the n-channel field effect transistor 17.

The source of the n-channel field effect transistor 17 is connected to the ground via a line 20. Furthermore, the drain of the n-channel field transistor 17 is connected via a line 21 with the line 8 (and thus with the gate terminal 7 of the n-channel field effect transistor 5).

A further reference voltage (REF1)—which is subject to relatively minor fluctuations only and is internally available in the device or has been obtained conventionally, respectively, and has possibly been divided to the respectively desired value by means of a voltage divider—is applied to the first input 15 of the comparator 13.

The further reference value (REF1) applied to the first input 15 of the comparator 13 is compared by the comparator 13 with a voltage (VEXT_DIV) applied to the second input 16 thereof, said voltage being generated by dividing of the supply voltage (VEXT)—e.g. by means of a further voltage divider (not illustrated). The further voltage divider may, for instance, comprise two resistors $R_3$, $R_4$ connected in series, with the first resistor $R_3$ being e.g. interposed between the supply voltage (VEXT) and the second resistor $R_4$, and the second resistor $R_4$ being interposed between the first resistor $R_3$ and the ground, and with the voltage (VEXT_DIV)—divided from the supply voltage (VEXT)—dropping over the second resistor $R_4$ being supplied to the second comparator input 16 by means of a line (not illustrated).

When the supply voltage (VEXT) falls below a certain threshold value (VEXT_THRESHOLD) (and if thus the voltage (VEXT_DIV) divided from the supply voltage falls below a threshold value (VEXT_DIV_THRESHOLD) or below the reference voltage (REF1), respectively), the output 14 of the comparator 13 changes its condition from "logically low" to "logically high" (and thus also the signal (COMP_OUT) applied to the line 18 and supplied to the gate terminal 19 of the n-channel field effect transistor 17).

When the signal (COMP_OUT) supplied to the gate terminal 19 of the n-channel field effect transistor 17 is "logically low", the gate voltage of the n-channel field effect transistor 17 lies below the transistor threshold voltage, i.e. the n-channel field effect transistor 17 is in a "locked condition".

When—on dropping of the supply voltage (VEXT) below the threshold value (VEXT_THRESHOLD)—the signal (COMP_OUT) supplied to the gate terminal 19 of the n-channel field effect transistor 17 changes its condition to "logically high" as explained, the gate voltage of the n-channel field effect transistor 17 becomes higher than the transistor threshold voltage, i.e. the field effect transistor 17 becomes conductive or changes to a (fully) "switched-on condition", respectively.

The gate terminal 7 of the p-channel field effect transistor 5 is thereby drawn to ground (0 V), and the p-channel field effect transistor 5 (which had only been partially switched on before) is fully switched on, and hence the voltage regulator 2—or more exactly the differential amplifier 4—is quasi "switched off" (since it then has no more influence on the value of the output voltage (VBLH) of the voltage regulating circuit arrangement 1).

By the full switching-on of the p-channel field effect transistor 5 it is achieved that the supply voltage (VEXT) applied to the source of the field effect transistor 5 via the line 9 is directly connected through to the line 10 connected with the drain of the field effect transistor 5; the output voltage of the voltage regulating circuit arrangement 1 is then, as is illustrated in FIG. 2,—apart from a small voltage $U_{DS}$ still dropping between the source and the drain of the field effect transistor 5—substantially as high as the supply voltage (VEXT).

The value of the supply voltage threshold value (VEXT_THRESHOLD) (or of the threshold value (VEXT_DIV_THRESHOLD) of the voltage (VEXT_DIV) divided from the supply voltage (VEXT)) may e.g. be adjusted to the respectively desired value by the voltage dividers used to generate the voltages (REF1) or (VEXT_DIV), respectively, applied to the inputs of the comparator 13, in particular the resistors used there (e.g. the above-mentioned resistors $R_3$ und $R_4$) being dimensioned appropriately.

Advantageously, the supply voltage threshold value (VEXT_THRESHOLD) is chosen such that it is substantially as high as the desired value VBLH_DES of the output voltage (VBLH) of the voltage regulating circuit arrangement 1 (or somewhat higher, e.g. 1%–10%, in particular 3%–8% higher, or e.g. by 0.01 V–0.2 V, in particular by 0.02 V–0.1 V higher, or e.g. approximately by the above-mentioned voltage $U_{DS}$ higher, than the desired value VBLH_DES of the output voltage (VBLH)).

The following effect is achieved by this: When the value of the supply voltage (VEXT) approaches (from initially higher values) the desired value VBLH_DES of the output voltage (VBLH) (at which the output voltage (VBLH) is regulated by the voltage regulator 2), without the "full switching-on" effected by the voltage regulator switch-off device 3 or the "switching-off" of the voltage regulator 2, respectively (or more exactly the differential amplifier 4), a relatively high voltage would drop at the voltage regulator 2, in particular between the source and the drain of the field effect transistor 5, and thus the output voltage (VBLH)—in particular when the value of the supply voltage (VEXT) is approximately as high as the desired value VBLH_DES of the output voltage (VBLH)—would become too small.

This is avoided in that—as explained above—when the value of the supply voltage (VEXT) approaches the desired value VBLH_DES of the supply voltage of the output voltage (VBLH) the voltage regulator 2 (or more exactly the differential amplifier 4) is "switched off" by the voltage regulator switch-off device 3 and the field effect transistor 5 is "fully switched on", and thus the supply voltage (VEXT) is directly connected through to the output of the voltage regulating circuit arrangement 1.

FIG. 3 shows a schematic representation of a voltage regulating circuit arrangement 101 in accordance with a further embodiment of the present invention.

It comprises—in correspondence with the voltage regulating circuit arrangement 1 shown in FIG. 1—a conventionally structured voltage regulator having a differential amplifier (AMP1) 104 and a field effect transistor 105 (here: a p-channel field effect transistor (MP1)).

Furthermore, a voltage regulating switch-off device is provided comprising a comparator (COMP1) 113, a field effect transistor 117 (here: an n-channel field effect transistor (MN1)), and—additionally—an inverter 122, and a further field effect transistor 123 (here: a p-channel field effect transistor (MP2)).

An output 106 of the differential amplifier 104 is connected via a line 108 with a gate terminal 107 of the field effect transistor 105.

As is further illustrated in FIG. 3, the source of the field effect transistor 105 is connected via a line 109 to the supply voltage (VEXT) which is unregulated, i.e. subject to (partially relatively strong) fluctuations.

A reference voltage (VBLH_REF)—which is subject to relatively minor fluctuations only and is available internally in the device or has been obtained conventionally, respectively—is applied to a positive input 112 of the differential amplifier 104.

In the case of a first development of the voltage regulator, the voltage (VBLH) output at the drain of the field effect transistor 105 is directly fed back to the differential amplifier 104; to this end, the drain of the field effect transistor 105 may be (directly) connected via a line 110 with a negative input 111 of the differential amplifier 104 (the fed-back voltage (VBLH_FB) applied to the negative input 111 of the differential amplifier 104 is then as high as the drain voltage (VBLH)).

In a second, alternative development, the voltage (VBLH) output at the drain of the field effect transistor 105 is fed back to the differential amplifier 104 by interposing a voltage divider (not illustrated), i.e. in a divided way. To this end, the drain of the field effect transistor 105 may be connected via the line 110 to a first resistor $R_{2'}$ (not illustrated) of the voltage divider which, on the one hand, is connected with the ground (via a further voltage divider resistor $R_{1'}$ (not illustrated, either)) and, on the other hand, with the negative input 111 of the differential amplifier 104 (the fed-back voltage (VBLH_FB) applied to the negative input 111 of the differential amplifier 104 is then by a certain factor smaller than the drain voltage (VBLH)).

In the above-mentioned first development of the voltage regulator (with direct feed-back of the drain voltage (VBLH)), the differential amplifier 104 regulates the voltage applied to the gate terminal 107 of the field effect transistor 105 such that the (fed-back) drain voltage (VBLH) is as high as the reference voltage (VBLH_REF).

As compared to this, in the case of the above-explained second, alternative development of the voltage regulator—where the drain voltage (VBLH) is not fed back directly, but by means of the above-mentioned voltage divider—the voltage applied to the gate terminal 107 of the field effect transistor 105 is regulated by the differential amplifier 104 such that the following applies:

$$VBLH = VBLH\_REF \times (1 + (R_{2'}/R_{1'})) \qquad \text{(formula (1'))}$$

The voltage (VBLH) output at the drain of the field effect transistor 105 constitutes the output voltage of the voltage regulating circuit arrangement 101 (the line 110 connected with the drain of the field effect transistor 105 may, for instance, be additionally connected with an output—not illustrated—of the voltage regulating circuit arrangement 101).

By the above-mentioned regulation it is achieved that the output voltage (VBLH) of the voltage regulating circuit arrangement 101 has a constant value VBLH_DES (but only when the supply voltage (VEXT) is higher than a certain threshold value (VEXT_THRESHOLD)—cf. the explanations below).

The value of VBLH_DES may, in the case of the above-mentioned second, alternative development of the voltage regulator in accordance with the above-mentioned formula (1')—with predetermined value of the reference voltage (VBLH_REF)—e.g. be adjusted to the respectively desired value by the resistor $R_{2'}$ or the resistor $R_{1'}$, respectively, being dimensioned appropriately (or, more exactly, the ratio of the resistance values $(R_{2'}/R_{1'})$ is chosen such that, in accordance with the above-mentioned formula (1') a corresponding—desired—value for VBLH results).

As is further shown in FIG. 3, the comparator 113 provided with the voltage regulating switch-off device comprises two inputs 115, 116, and one (logic) output 114.

The output 114 of the comparator 113 is connected via a line 118 to a gate terminal 119 of the n-channel field effect transistor 117, and via a line 124 with an input of the inverter.

The source of the n-channel field effect transistor 117 is connected to the ground via a line 120. Furthermore, the drain of the n-channel field transistor 117 is connected via a line 121 with the line 108 (and thus with the gate terminal 107 of the n-channel field effect transistor 105).

An output of the inverter 122 is connected via a line 125 with a gate terminal 126 of the p-channel field effect transistor 123.

The source of the p-channel field effect transistor 123 is connected via a line 127 to the supply voltage (VEXT), and the drain of the p-channel field effect transistor 123 is connected via a line 128 to the line 110 (and thus to the output of the voltage regulating circuit arrangement 101).

A further reference voltage (REF1)—which is subject to relatively minor fluctuations only and is internally available in the device or has been obtained conventionally, respectively, and has possibly been divided to the respectively desired value by means of a voltage divider—is applied to the first input 115 of the comparator 113.

The further reference value (REF1) applied to the first input 115 of the comparator 113 is compared by the comparator 113 with a voltage (VEXT_DIV) applied to the second input 116 thereof, said voltage being generated by dividing of the supply voltage (VEXT)—e.g. by means of a further voltage divider (not illustrated).

The further voltage divider may, for instance, comprise two resistors $R_{3'}$, $R_{4'}$ connected in series, with the first resistor $R_{3'}$ being e.g. interposed between the supply voltage (VEXT) and the second resistor $R_{4'}$, and the second resistor $R_{4'}$ being interposed between the first resistor $R_{3'}$ and the ground, and with the voltage (VEXT_DIV)—divided from the supply voltage (VEXT)—dropping over the second resistor $R_{4'}$ being supplied to the second comparator input 116 by means of a line (not illustrated).

When the supply voltage (VEXT) falls below a certain threshold value (VEXT_THRESHOLD) (and if thus the voltage (VEXT_DIV) divided from the supply voltage falls below a threshold value (VEXT_DIV_THRESHOLD) or below the reference voltage (REF1), respectively), the output 114 of the comparator 113 changes its condition from "logically low" to "logically high" (and thus also the signal (COMP_OUT) applied to the line 118 and supplied to the gate terminal 119 of the n-channel field effect transistor 117, and to the input of the inverter 122).

When the signal (COMP_OUT) supplied to the gate terminal 119 of the n-channel field effect transistor 117 is "logically low", the gate voltage of the n-channel field effect transistor 117 lies below the transistor threshold voltage, i.e. the n-channel field effect transistor 117 is in a "locked condition".

When the signal (COMP_OUT) supplied to the gate terminal 119 of the n-channel field effect transistor 117 changes—on dropping of the supply voltage (VEXT) below the threshold value (VEXT_THRESHOLD)—its condition to "logically high" as explained, the gate voltage of the n-channel field effect transistor 117 becomes higher than the transistor threshold voltage, i.e. the field effect transistor 117 becomes conductive or changes to a (fully) "switched-on condition", respectively.

The gate terminal 107 of the p-channel field effect transistor 105 is thereby drawn to ground (0 V), and the p-channel field effect transistor 105 (which had only been partially switched on before) is fully switched on, and hence the voltage regulator—or more exactly the differential amplifier 104—is quasi "switched off" (since it then has no more influence on the value of the output voltage (VBLH) of the voltage regulating circuit arrangement 101).

Furthermore—on changing of the condition of the signal (COMP_OUT) supplied to the input of the inverter 122 (on dropping of the supply voltage (VEXT) below the threshold value (VEXT_THRESHOLD)) from "logically low" to "logically high"—the output of the inverter 122 changes its condition from "logically high" to "logically low".

This effects—in correspondence with the first p-channel field effect transistor 105—that the gate terminal 126 of the second p-channel field effect transistor 123 (which is connected in parallel to the first p-channel field effect transistor 105) is also drawn to ground (0 V).

The second p-channel field effect transistor 123 thus changes from a "switched-off" to a (fully) "switched-on" condition.

By the full switching-on of the two p-channel field effect transistors 105, 123 it is achieved that the supply voltage (VEXT) applied to the respective sources of the field effect transistors 105, 123 via the lines 109 or 127, respectively, is directly connected through to the line 10 connected with the respective drains of the field effect transistors 105, 123; the output voltage of the voltage regulating circuit arrangement 101 is then, as will be explained in detail further below, substantially as high as the supply voltage (VEXT).

The value of the supply voltage threshold value (VEXT_THRESHOLD) (or of the threshold value (VEXT_DIV_THRESHOLD) of the voltage (VEXT_DIV) divided from the supply voltage (VEXT)) may e.g. be adjusted to the respectively desired value by the voltage dividers used to generate the voltages (REF1) or (VEXT_DIV), respectively, applied to the inputs of the comparator 113, in particular the resistors used there (e.g. the above-mentioned resistors $R_{3'}$ und $R_{4'}$) being dimensioned appropriately.

Advantageously, the supply voltage threshold (VEXT_THRESHOLD) is chosen such that it is substantially as high as the desired value VBLH_DES of the output voltage (VBLH) of the voltage regulating circuit arrangement 101 (or somewhat higher, e.g. 1%–10%, in particular 3%–8% higher, or e.g. by 0.01 V–0.2 V, in particular by 0.05 V–0.1 V higher, than the desired value VBLH_DES of the output voltage (VBLH)).

When the value of the supply voltage (VEXT) approaches (from initially higher values) the desired value VBLH_DES of the output voltage (VBLH), without the "full switching-on" of the p-channel field effect transistors 15, 123 effected by the voltage regulator switch-off device 3, or the "switching-off" of the voltage regulator, respectively (or more exactly the differential amplifier 104), a relatively high voltage would drop between the source and the drain of the field effect transistor 105, and thus the output voltage (VBLH)—in particular when the value of the supply voltage (VEXT) is approximately as high as the desired value VBLH_DES of the out-put voltage (VBLH)—would become too small.

This is avoided in that—as explained above—when the value of the supply voltage (VEXT) approaches the desired value VBLH_DES of the supply voltage of the output voltage (VBLH) the voltage regulator (or more exactly the differential amplifier 104) is "switched off" by the voltage regulator switch-off device 103 and the p-channel field effect transistors 105, 123 are "fully switched on" (and thus the supply voltage (VEXT) is directly connected through to the output of the voltage regulating circuit arrangement 101).

The output voltage (VBLH) of the voltage regulating circuit arrangement 101 is then—apart from a very small voltage $U_{DS'}$ still dropping between the source and the drain of the field effect transistors 105, 123—substantially as high as the supply voltage (VEXT). By the fact that two transistors (here: the two p-channel field effect transistors 105, 123) are "fully switched on" in parallel (and not, for instance, only one single transistor), the voltage $U_{DS'}$ dropping over them is further decreased—and thus the danger that the out-put voltage (VBLH) of the voltage regulating circuit arrangement 101 becomes too small.

What is claimed is:

1. A voltage regulating circuit arrangement for converting a first, external voltage (VEXT) applied to an input of said voltage regulating circuit arrangement into a second voltage (VBLH) output at an output of said voltage regulating circuit arrangement, the circuit arrangement comprising:

a feedback regulating device for providing a control signal to a transistor connected between the input and the output of the voltage regulating circuit arrangement such as to regulate the level of said second voltage to a predetermined value; and a comparing device for detecting whether the level of said first voltage is below or above a threshold value (VEXT_THRESHOLD), and for providing, in response to the detection, a logic high or a logic low control signal to control the transistor such that the transistor is fully switched on when the level of said first voltage is below the threshold value.

2. The voltage regulating circuit arrangement according to claim 1, wherein said second voltage (VBLH) is regulated at a predetermined value (VBLH_DES).

3. The voltage regulating circuit arrangement according to claim 2, wherein said second voltage (VBLH) is regulated at said predetermined value (VBLH_DES) by means of a regulating device, said device comprising a transistor interposed between the input and the output of said voltage regulating circuit arrangement.

4. The voltage regulating circuit arrangement according to claim 1, wherein the through-connection of the first voltage (VEXT) applied to the input of said voltage regulating circuit arrangement to said output of said voltage regulating circuit arrangement is achieved in that a transistor, in particular the transistor of said regulating device, is switched on.

5. The voltage regulating circuit arrangement according to claim 4, wherein said threshold value (VEXT_THRESHOLD) is approximately equal to, or somewhat larger than, said predetermined value (VBLH_DES) at which said second voltage (VBLH) is regulated.

6. The voltage regulating circuit arrangement according to claim 5, wherein said regulating device comprises an amplifier device to which a signal (VBLH_FB) applied to the output of said voltage regulating circuit arrangement or derived therefrom is fed back.

7. The voltage regulating circuit arrangement according to claim 6, wherein a comparing device is provided for determining whether said threshold value (VEXT_THRESHOLD) has been fallen below.

8. The voltage regulating circuit arrangement according to claim 7, wherein, on through-connection of said first voltage (VEXT) applied to the input of said voltage regulating circuit arrangement to said output of said voltage regulating circuit arrangement, one or several further transistors interposed between the input and said output of said voltage regulating circuit device are switched on in addition to said transistor.

9. A voltage regulating circuit comprising:

a external voltage (VEXT) applied to an input of the voltage regulating circuit;

an output voltage (VBLH) provided at an output of the voltage regulating circuit;

a switching device coupled between the input and the output of the voltage regulating circuit, which may at least be switched between an ON and OFF state;

a feedback regulating device coupled to said switching device for providing a control signal to said switching device to regulate a value of said output voltage (VBLH);

a comparing device for determining whether the value of said external voltage (VEXT) is below a threshold value (VEXT_THRESHOLD);

wherein when said external voltage (VEXT) is determined to be below the threshold value (VEXT_THRESHOLD), said switching device is switched to a fully ON state.

* * * * *